United States Patent

Schultz

[19]

[11] Patent Number: 6,005,423
[45] Date of Patent: *Dec. 21, 1999

[54] LOW CURRENT POWER-ON RESET CIRCUIT

[75] Inventor: David P. Schultz, San Jose, Calif.

[73] Assignee: Xilinx, Inc., San Jose, Calif.

[*] Notice: Under 35 U.S.C. 154(b), the term of this patent shall be extended for 891 days.

[21] Appl. No.: 08/546,345

[22] Filed: Oct. 20, 1995

Related U.S. Application Data

[63] Continuation of application No. 08/194,552, Feb. 10, 1994, abandoned.

[51] Int. Cl.[6] .................................................. H03K 17/22
[52] U.S. Cl. ........................................ 327/143; 327/198
[58] Field of Search ........................... 307/296.1, 296.2, 307/296.4, 272.3, 592, 594, 296.5; 327/142, 143, 198

[56] References Cited

U.S. PATENT DOCUMENTS

| | | | |
|---|---|---|---|
| 4,300,065 | 11/1981 | Remedi et al. ....................... | 307/272.3 |
| 4,385,245 | 5/1983 | Ulmer ..................................... | 307/594 |
| 4,460,835 | 7/1984 | Masuoka ................................ | 327/536 |
| 4,461,963 | 7/1984 | Koomen ............................... | 307/296.5 |
| 4,469,957 | 9/1984 | Krüger et al. ........................ | 307/296.4 |
| 4,611,126 | 9/1986 | Miller ..................................... | 307/64 |
| 4,634,905 | 1/1987 | Campbell, Jr ......................... | 307/594 |
| 4,748,352 | 5/1988 | Kamiya et al. ........................ | 307/592 |
| 4,885,476 | 12/1989 | Mahabadi .............................. | 307/272.3 |
| 4,888,497 | 12/1989 | Dallabora et al. .................... | 307/272.3 |
| 4,983,857 | 1/1991 | Steele ..................................... | 307/272.3 |
| 5,109,163 | 4/1992 | Benhamida .......................... | 307/272.3 |
| 5,115,146 | 5/1992 | McClure .................................. | 307/594 |
| 5,115,150 | 5/1992 | Ludwig ..................................... | 326/86 |
| 5,144,159 | 9/1992 | Frisch et al. .......................... | 307/272.3 |
| 5,166,545 | 11/1992 | Harrington ............................ | 307/272.3 |
| 5,177,375 | 1/1993 | Ogawa et al. ......................... | 307/272.3 |
| 5,180,926 | 1/1993 | Skripek .................................. | 307/272.3 |
| 5,302,861 | 4/1994 | Jelinek .................................. | 307/272.3 |
| 5,323,067 | 6/1994 | Shay ....................................... | 307/264 |
| 5,444,401 | 8/1995 | Crafts ..................................... | 327/108 |

FOREIGN PATENT DOCUMENTS

| | | | |
|---|---|---|---|
| 58-3424 | 1/1983 | Japan .................................. | 307/296.4 |
| 62-210723 | 9/1987 | Japan .................................. | 307/272.3 |

OTHER PUBLICATIONS

Wong, Sau–Ching et al., "Novel Circuit Techniques for Zero–Power 25–ns CMOS Erasable Programmable Logic Devices (EPLD's)", IEEE Journal of Solid–State Circuits, vol. SC–21, No. 5, pp. 766–773, Oct. 1986.

*Primary Examiner*—Kenneth B. Wells
*Attorney, Agent, or Firm*—Edel M. Young; Norman R. Klivans

[57] ABSTRACT

A power-on reset circuit responds to a power decrease of very short duration by using a delay circuit having a high threshold inverter which reliably detects a voltage as high as a standard threshold voltage as a low voltage when the power supply voltage again begins to increase. A very low current source provides current for driving the power-on reset circuit only when providing a power-on reset signal and draws no current during normal circuit operation.

5 Claims, 4 Drawing Sheets

LOW CURRENT POWER-ON RESET CIRCUIT

This application is a continuation of application Ser. No. 08/194,552, filed Feb. 10, 1994, abandoned.

FIELD OF THE INVENTION

This invention relates to integrated circuits and more particularly to power-on reset circuits which generate a reset signal in response to being powered up.

BACKGROUND

Power-on reset circuits are widely used in integrated circuit devices to generate a reset signal. Typically they generate a high reset signal, usually equal to the value of the positive voltage supply, during part of the time the supply voltage is rising from zero volts to the final operating voltage, and as the supply voltage reaches an acceptable value, they return the reset signal to a low signal so that operation of the integrated circuit can begin. Power-on reset circuits also generate a reset signal if the supply voltage falls sufficiently during operation that circuit operation might be improper.

Prior power-on reset circuits have several disadvantages:

1) During operation, the power-on reset circuit draws power.
2) In some power-on reset circuits there is no supply voltage threshold detection. The POR signal is released after a certain amount of time regardless of the voltage supply level. If the supply voltage is too low, incorrect circuit operation may result.
3) The length of time the reset pulse is asserted depends to a considerable extent upon the voltage supply rise time, and may not be sufficient to assure that the power supply voltage has had time to stabilize.
4) Some power-on reset circuits do not reliably generate reset pulses if there is a quick power cycle, that is, if voltage is brought to zero and quickly back to normal level.

FIG. 1 shows a prior art power-on reset circuit 11 such as illustrated by Wong et al., at page 769 in the article "Zero-Power 25-ns CMOS EPLD's" published in the IEEE Journal of Solid-State Circuits, Vol. SC-21, No. 5, October 1986. Capacitive node N1 drives inverter I1 and is driven by inverter I2. When the supply voltage Vcc is lowered to ground level, capacitor C1 is discharged through diode D1, which is formed by the P-channel transistor of inverter I2. Since diode D1 turns off when the voltage difference between N1 and Vcc is less than about 0.7 volts, capacitor C1 does not discharge below about 0.7 volts. Over time, capacitor C1 will continue to discharge through leakage. However, if the supply voltage is brought high again while capacitive node N1 is still at about 0.7 volts, inverter I1 will interpret its input node as a high voltage (N1 is higher than Vcc) and will generate a low output voltage. Thus power-on reset circuit 11 will fail to generate a high reset signal POR.

FIG. 2 shows another prior art power-on reset circuit discussed in Harrington, U.S. Pat. Nos. 5,166,545 FIGS. 4A6 and 4A6a. Since transistor 202 will turn on as soon as the supply voltage reaches one NMOS threshold voltage (about 0.7 volts), it is possible for the POR signal to be turned off while the supply voltage is at an unsafely low level.

FIG. 3 shows another prior art power-on reset circuit shown in FIG. 8 of Ogawa, et al. U.S. Pat. No. 5,177,375. Ogawa discloses a device which uses a P-channel transistor Q11 to provide a discharge path when power goes to a low value. The voltage at node 1 will be brought to about 0.7 volts through P-channel transistor Q11, but since Ogawa's inverter 25 is not a high threshold inverter, this 0.7 volts will be interpreted as a logical 1 when power again begins to rise, so a short power drop does not cause the device of FIG. 8 of Ogawa to generate a reset signal.

As mentioned above, another weakness of prior art devices is the consumption of power during operation of the chip. FIG. 4 shows a circuit disclosed in U.S. Pat. 5,109,163 to Benhamida, which does find a method of discharging a reference node to ground in response to a fast drop in power, but in FIG. 4 a current path exists from the positive voltage supply at node 12 to ground during operation of the circuit. To respond to a quick power drop, node A is discharged to ground by transistor Q3 in response to power again rising, and provides a low signal to inverter 18, which provides a high output signal at node B, turning on transistor Q4. Transistor Q4 therefore pulls node C to ground so that when power continues to rise, the low voltage at node C causes a reset signal to be generated. However, during operation there is a current path to ground from node 12 through node A, and thus this circuit draws power during circuit operation.

It is desirable to provide a power-on reset circuit which overcomes the above disadvantages.

SUMMARY OF THE INVENTION

The present invention uses a delay circuit in which a reference node is pulled to ground during times of low supply voltage. The reference node is connected to ground through a capacitor. As the supply voltage reaches a minimum level the ground pull-down is turned off and replaced by a very low current source. Thus the voltage at the reference node rises only slowly even if the capacitor is small. A voltage level detector circuit turns off the reference node pull-down when voltage has reached an intermediate level and turns off the low current source after the delay circuit has turned off the power-on reset signal.

During power-up, the trigger voltage at which the voltage level is detected to switch from low to high is determined by MOS transistor threshold voltages, which are reliable process parameters. The length of time the reset pulse is asserted depends upon a capacitor size and a current value, and not primarily upon supply voltage rise time, a parameter not within the control of the circuit designer. And, very advantageously, during operation of the integrated circuit at normal power supply voltages, the power-on reset circuit consumes no power.

DETAILED DESCRIPTION OF THE DRAWINGS

Figure 5:
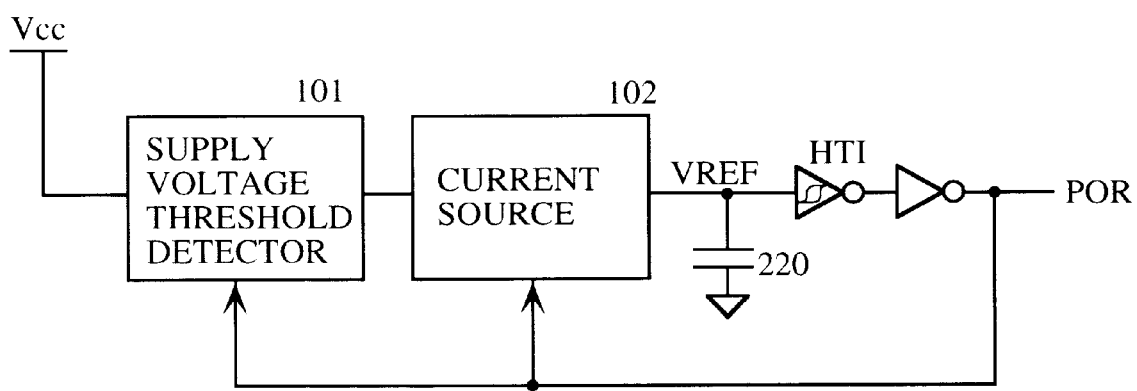
FIG. 5 shows a block diagram of the power-on reset circuit of the invention.

FIG. 5 shows a block diagram of a circuit according to the invention. Supply voltage threshold detector 101 responds to the supply voltage Vcc level, and when this level is sufficient, detector 101 provides a signal to current source 102, turning on current source 102. In response to the signal from detector 101, current source 102 applies a small current to the VREF terminal of capacitor 220. Thus the voltage at VREF begins to rise. High threshold inverter HTI has a trigger point considerably higher than the threshold voltage of various transistors in the system. For example if the transistors have a threshold voltage on the order of 0.7 volts, inverter HTI may have a trigger point on the order of 2.0 volts. When the voltage at VREF rises above this trigger point, inverter HTI outputs a low voltage, producing a high POR signal. This high POR signal is applied to various points in the integrated circuit of which the invention is a part and allows normal circuit operation to commence. The high POR signal is also applied to supply voltage threshold detector 101 and current source 102 to turn off these devices during normal circuit operation and thus conserve power.

Figure 6A:
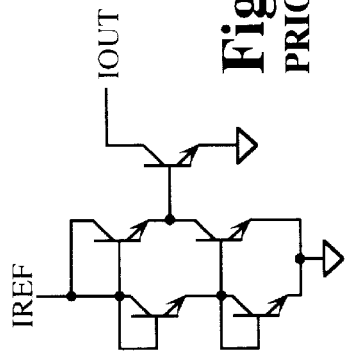
FIG. 6A shows a prior art bipolar current source circuit similar to a circuit used in the current source circuit of FIG. 6.
Figure 6:
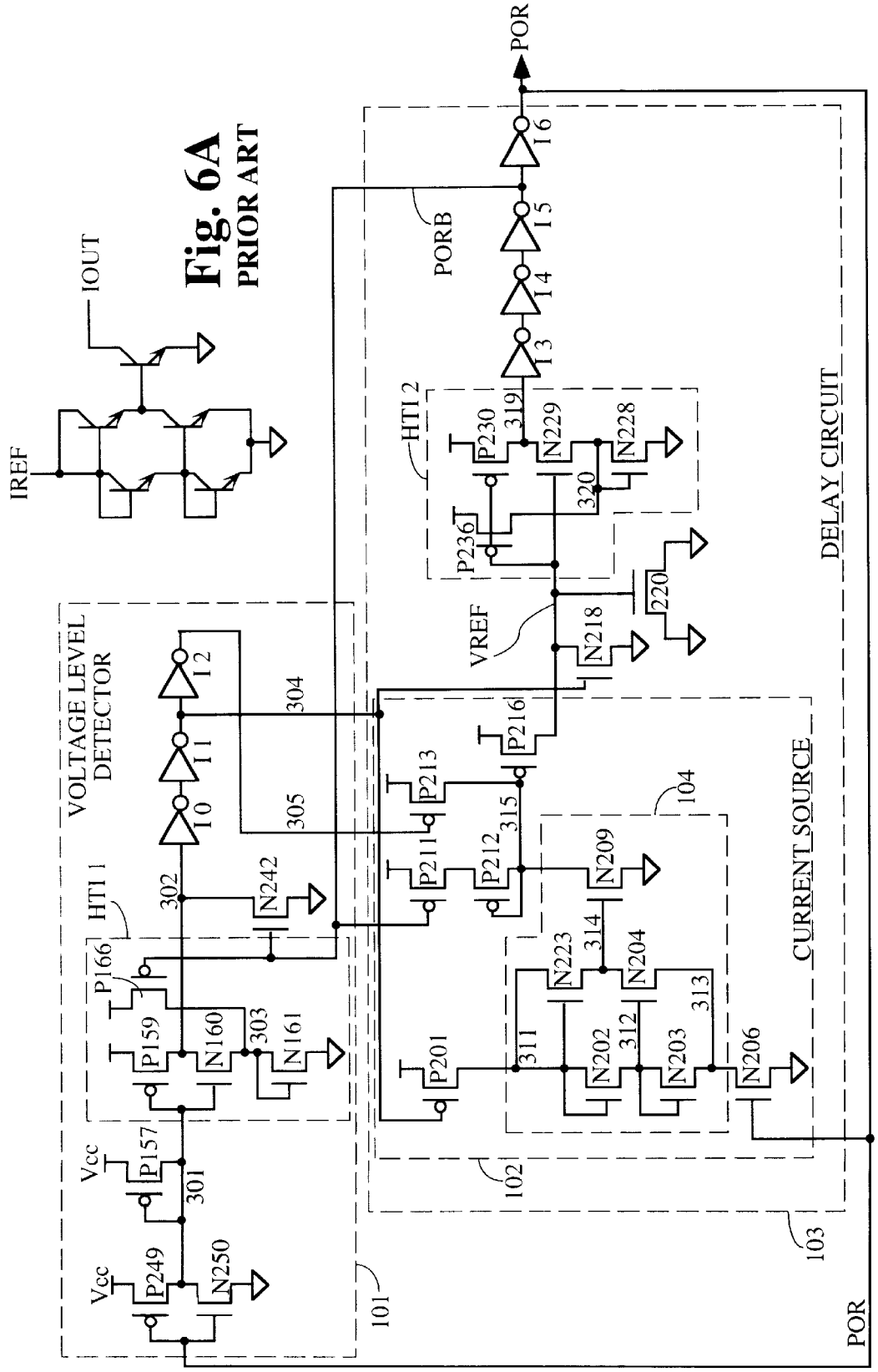
FIG. 6 shows an embodiment of the invention incorporating the delay circuit and voltage level detector according to the invention.

FIG. 6 shows an embodiment of the invention incorporating the delay circuit and voltage level detector according to the invention. As shown in FIG. 6, a delay circuit 103 generates a power-on reset signal POR under control of the supply voltage Vcc and a voltage level detector 101.

Operation of the circuit of FIG. 6 will be described for three phases of powering up.

The first phase exists when supply voltage Vcc is below about 2 volts. A high threshold inverter HTI2 detects a reference voltage VREF as a low signal when VREF is below about 2 volts. High threshold inverter HTI2 includes a standard CMOS inverter comprising P-channel transistor P230 and N-channel transistor N229. However, N-channel transistor N229 is connected, not to ground, but to the drain of another N-channel transistor N228. Since VREF starts below 0.7 volts, as Vcc rises, the low voltage at VREF turns on transistor P230 so that node 319 follows Vcc. The rising voltage on node 319 produces a low output from inverter I3, a rising output from inverter I4, a low output from inverter I5, (the PORB signal) and a rising output from inverter I6, which is the POR signal. While the POR signal is high (following Vcc), P-channel transistor P157 is turned on by the weak N-channel transistor N250. Thus node 301 rises one threshold voltage below Vcc. High threshold voltage inverter HTI1, because of N-channel transistor N161 and the pull-up from P-channel transistor P166 detects this intermediate input voltage (perhaps 1.3 volts) as a low voltage and generates a rising output voltage at node 302. Node 302 is not pulled low by N-channel transistor N242 because the PORB signal output from inverter I5 is low at this first phase of powering up and therefore N-channel transistor N242 is off. Thus inverter I0 provides a low output signal and inverter I1 provides a rising output signal. Finally, this rising output signal causes inverter I2 to provide a low output signal on line 305 from voltage level detector 101. This low output signal turns on P-channel transistor P213, so that node 315 carries a rising voltage, which turns off transistor P216. The rising output signal on line 304 turns on N-channel transistor N218, which pulls VREF to zero volts. As long as voltage level detector 101 detects that the voltage level is low (lower than sufficient to cause high threshold voltage inverter HTI1 to detect a high voltage), transistor P216 remains off and transistor N218 remains on. Thus VREF remains at 0 volts. The signal on node 304 also turns off transistor P201, which prevents low current source 102 from turning on.

As the supply voltage Vcc rises above about 2 volts, the rising Vcc voltage level pulls up node 301 above about 1.3 volts so that high threshold inverter HTI1 detects a high input signal and outputs a low voltage on node 302, which results in a low voltage on node 304 and a rising voltage on voltage level detector output node 305. This combination of voltage levels turns off transistors P213 and N218, and turns on transistors P201 and P211. There is now a current path from Vcc to ground through transistors P201, N202, N203, N206 and another current path through P201, N223, N204, and N206. The ratio of channel widths of transistors N202, N203, N223, N204, and N209 produces a very small current for charging capacitor 220. In one embodiment, transistor sizes are as shown in Table I.

TABLE I

| Transistor | Width, microns | Length, microns |
| --- | --- | --- |
| P249 | 4 | 10 |
| N250 | 4 | 10 |
| P157 | 40 | 0.9 |
| P159 | 4 | 4 |
| N160 | 20 | 2 |
| N161 | 40 | 0.8 |
| P166 | 4 | 10 |
| N242 | 4 | 2 |
| I0, P | 8 | 2 |
| I0, N | 4 | 2 |
| I1, P | 8 | 0.9 |
| I1, N | 4 | 0.8 |
| I2, P | 12 | 0.9 |
| I2, N | 6 | 0.8 |
| P201 | 4 | 4 |
| N202 | 40 | 2 |
| N203 | 10 | 2 |
| N206 | 40 | 0.8 |
| N223 | 10 | 2 |
| N204 | 40 | 2 |
| P211 | 40 | 0.9 |
| P212 | 20 | 2 |
| N209 | 8 | 4 |
| P213 | 4 | 4 |
| P216 | 4 | 4 |
| P216 | 4 | 4 |
| N218 | 8 | 2 |
| 220 (N-capacitor) | 200 | 10 |
| P236 | 4 | 10 |
| P230 | 12 | 2 |
| N229 | 6 | 2 |
| N228 | 40 | 0.8 |
| I3, P | 4 | 2 |
| I3, N | 2 | 2 |
| I4, P | 12 | 0.9 |
| I4, N | 6 | 0.8 |
| I5, P | 36 | 0.9 |
| I5, N | 18 | 0.8 |
| I6, P | 36 | 0.9 |
| I6, N | 18 | 0.8 |

In one embodiment, current through transistor P216 for charging capacitor 220 is on the order of 3 nÅ. This very low current is achieved through a current mirror comprising transistors P212 and P216 in which the width of transistor P216 is one fifth that of transistor P212, and therefore transistor P216 carries only one fifth the current of transistor P212. But the current through transistor P212 is already made small by node 314 controlling transistor N209. Transistor N209 is the output transistor of primary current source 104 comprising transistors N202, N203, N204, N223, and N209. The arrangement of transistors in primary current source 104 is a MOS equivalent to a prior art bipolar current source shown in FIG. 6A, which was illustrated to a class of students including the present inventor by Professor Robert G. Meyer at University of California at Berkeley, California in 1992. Transistors N202, N203, N204, N223, and N209 comprise a current divider which produces an output current at the drain of transistor N209 which is many times smaller than the input current at the drain of transistor P201. The input current is approximately 200 μÅ as set by the width and length of transistor P201. The ratio of widths in the current divider (see Table I) sets the ratio of input current to output current. In this embodiment the ratio of current through transistor P201 to current through transistor N209 is approximately 7,000. With a further division by about 10, the output current through transistor P216 is approximately 3 nÅ. The current through transistor P216 begins to pull up VREF. Since the current through P216 is on the order of 3 nÅ, the voltage at VREF rises slowly. Only after VREF has risen above about 2 volts does high threshold inverter HTI2 detect a high input voltage and trigger a low output voltage on node 319. This low voltage produces a high PORB signal and a low POR signal, so the circuit can begin normal operation. In the embodiment discussed here, the low current through transistor P216 causes a delay on the order of 2 ms from the time transistor P216 turns on until VREF has risen sufficiently to turn off the POR signal.

When the POR signal goes low, transistor N206 turns off, thus shutting off the current paths through transistor N206. The high PORB signal turns off transistor P211, thus shutting off the current path through P211. The low POR signal causes transistor P249 to place a high voltage on node 301, which in turn causes high threshold inverter HTI1 to place a low voltage on node 302. The high PORB voltage on the gate of N-channel transistor N242 also pulls down node 302 and ensures that the voltage reaches ground. Thus voltage level detector 101 continues to generate a high output signal on node 305 and a low output signal on node 304. The low output signal on node 304 tends to turn on transistor P201, thus bringing node 314 to a high level. This in turn tends to turn on transistor N209, which pulls node 315 low and turns on transistor P216, thus maintaining VREF at a high level. During this steady operating stage, there are no current paths from Vcc to ground. Therefore power consumption by the POR circuit is only from leakage current.

Figure 1:
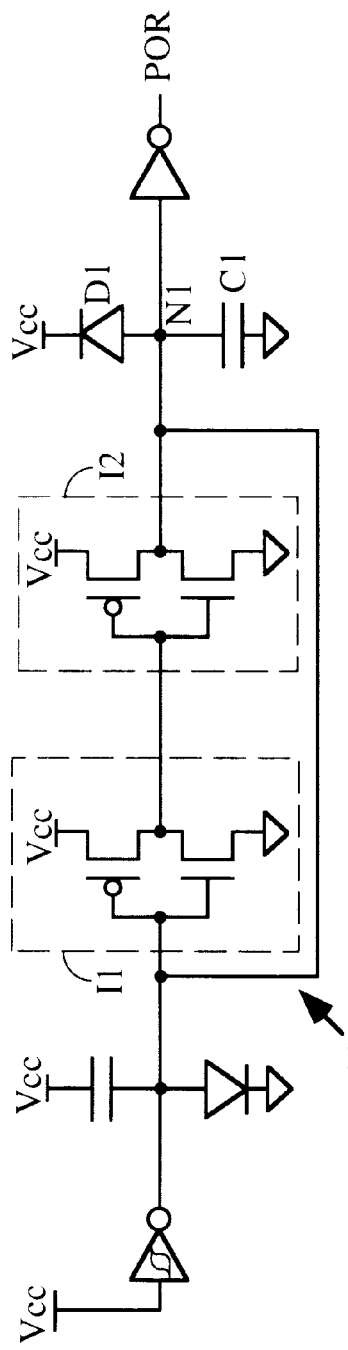
FIG. 1 shows a prior art power-on reset circuit.
Figure 2:
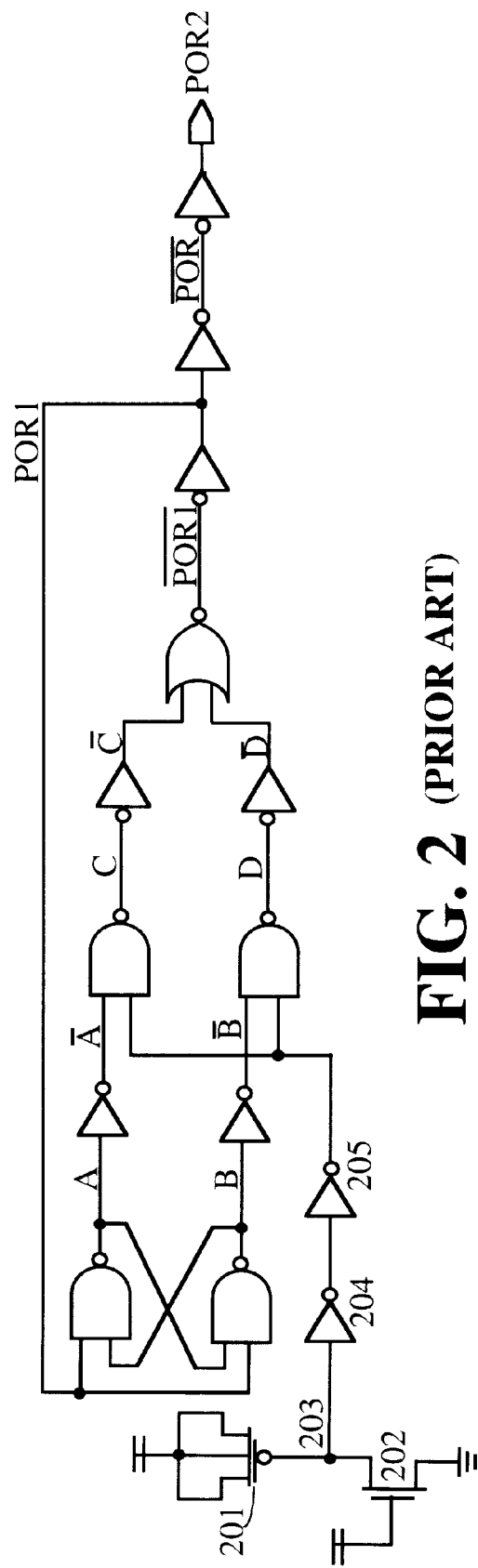
FIG. 2 shows another prior art power-on reset circuit discussed in Harrington, U.S. Pat. No. 5,166,545.
Figure 3:
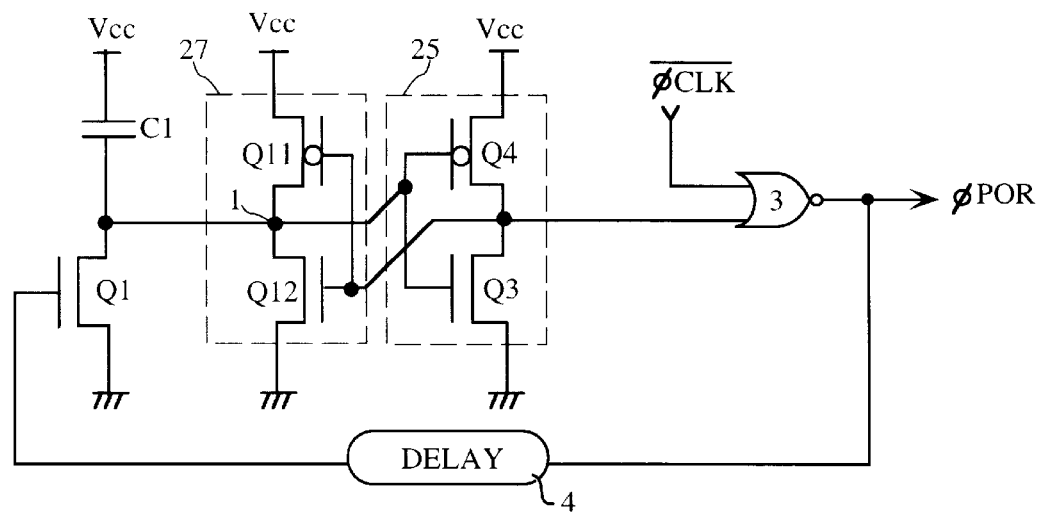
FIG. 3 shows yet another prior art power-on reset circuit shown in FIG. 8 of Ogawa, et al. U.S. Pat. No. 5,177,375.
Figure 4:
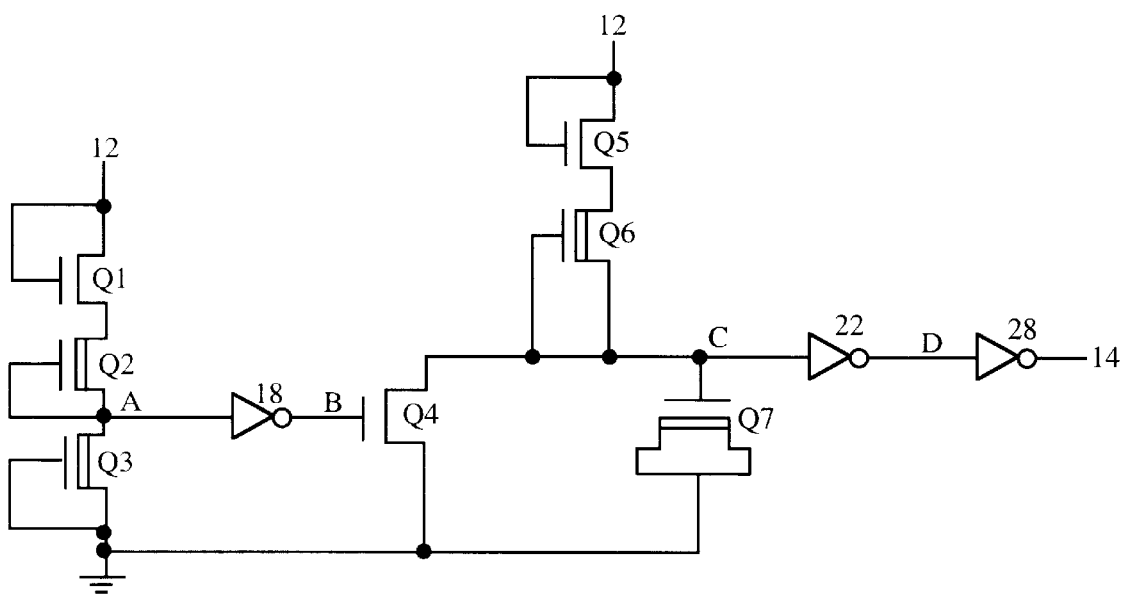
FIG. 4 shows a prior art circuit disclosed in U.S. Pat. No. 5,109,163 to Benhamida.

If the power supply voltage is brought to zero volts, the VREF node discharges through the diode formed by PMOS transistor P216 and the N-well. This brings the VREF voltage down to about 0.7 volts. When the power supply voltage rises again, this 0.7 volt level is sensed as a low input by inverter HTI2. Thus, in comparison to a capacitive POR circuit such as shown in FIG. 1, the circuit of FIG. 6 reliably generates a high POR reset signal due to the action of high threshold inverter HTI2. And, importantly, in the current invention, the capacitive node (VREF in FIG. 6, for example) drives a high threshold inverter which does not detect a 0.7 volt input level as a high voltage. Thus no matter how fast power is cycled, the circuit still generates a high POR pulse. Another important benefit of the present invention is a very long reset pulse length (in one embodiment on the order of 2 ms), which assures that the power supply voltage has had time to settle before operation commences.

Other embodiments of the present invention will become obvious to those skilled in the art in light of the above disclosure.

I claim:

1. A power-on reset circuit comprising:

a reference node;

a voltage level detector for pulling down a reference voltage at said reference node when a supply voltage is not above around voltage by a first predetermined level; and a current source for applying a current to said reference node when said supply voltage is above a second predetermined level;

an inverter receiving an input signal from said reference node, said inverter having a threshold voltage sufficiently higher than a residual voltage to which said reference node discharges when said supply voltage is not above said first predetermined level that said residual voltage at said reference node will cause said inverter to provide a logical 1 output signal;

said inverter comprising:
a PMOS transistor, a first NMOS transistor, and a second NMOS transistor connected in series, said PMOS transistor connected to said supply voltage and said second NMOS transistor connected to said around voltage, and
means for turning on said second NMOS transistor.

2. A power-on reset circuit as in claim 1 in which said current source comprises:

means for providing a current path from a supply voltage terminal to a ground terminal; and means for causing said current path to carry a first current when said supply voltage is below said first predetermined level and above said second predetermined level, and otherwise to carry no current.

3. A power-on reset circuit as in claim 1 in which said current source supplies a current sufficiently low that a reset signal remains active for a period of time on the order of 2 ms.

4. A power-on reset circuit as in claim 2 further comprising:

a current divider which provides a second current which is a selected fraction of said first current.

5. A power-on reset circuit as in claim 4 in which said current source further comprises:

a current mirror which provides to said reference node a current which is a fraction less than 1 of said second current.

* * * * *